United States Patent [19]

Kanai

[11] Patent Number: 4,518,949
[45] Date of Patent: May 21, 1985

[54] METHOD OF A/D CONVERSION BY SUCCESSIVE APPROXIMATIONS

[75] Inventor: Tetsuro Kanai, Tokyo, Japan

[73] Assignee: NEC Corporation, Tokyo, Japan

[21] Appl. No.: 504,153

[22] Filed: Jun. 14, 1983

[30] Foreign Application Priority Data

Jun. 15, 1982 [JP] Japan ................... 57-102616

[51] Int. Cl.³ .................................. H03K 13/03
[52] U.S. Cl. .................................. 340/347 AD
[58] Field of Search ............... 340/347 AD, 347 CC, 340/347 DA

[56] References Cited

U.S. PATENT DOCUMENTS 3,216,001  11/1965  Hinrichs ............... 340/347 AD
4,196,420  4/1980  Culmer ................ 340/347 AD Primary Examiner—Charles D. Miller
Attorney, Agent, or Firm—Burns, Doane, Swecker & Mathis

[57] ABSTRACT

An approximation control code is initially set to logic "1" except for the MSB which is set to logic "0". At the m-th comparison, if a sampled analog signal is greater than a comparison reference signal proportional to the control code, the m-th and (m+1)th MSBs of the control code are replaced by logics "1" and "0" respectively, and, if the sampled analog signal is less than the comparison reference signal, the (m+1)th MSB is replaced with logic "0".

1 Claim, 5 Drawing Figures

TABLE 1

| BINARY NUMBERS | DECIMAL NUMBERS |
|---|---|
| 1111 1111 | (255) |
| 1111 1110 | (254) |
| 1111 1101 | (253) |
| 1111 1011 | (251) |
| 1111 0111 | (247) |
| 1110 1111 | (239) |
| 1101 1111 | (223) |
| 1011 1111 | (191) |
| 0111 1111 | (127) |
| 0011 1111 | (63) |
| 0001 1111 | (31) |
| 0000 1111 | (15) |
| 0000 0111 | (7) |
| 0000 0011 | (3) |
| 0000 0001 | (1) |
| 0000 0000 | (0) |

TABLE 2

| BINARY NUMBERS | DECIMAL NUMBERS |
|---|---|
| 1011 1111 | (191) |
| ⋮ | |
| 1001 1111 | (159) |
| 1001 1110 | (158) |
| 1001 1101 | (157) |
| 1001 1100 | (156) |
| 1001 1011 | (155) |
| 1001 1010 | (154) |
| 1001 1001 | (153) |
| 1001 1000 | (152) |
| 1001 0111 | (151) |
| 1001 0110 | (150) |
| 1001 0101 | (149) |
| 1001 0100 | (148) |
| 1001 0011 | (147) |
| 1001 0010 | (146) |
| 1001 0001 | (145) |
| 1001 0000 | (144) |
| 1000 1111 | (143) |
| 1000 1110 | (142) |
| 1000 1101 | (141) |
| 1000 1100 | (140) |
| 1000 1011 | (139) |
| 1000 1010 | (138) |
| 1000 1001 | (137) |
| 1000 1000 | (136) |
| 1000 0111 | (135) |
| 1000 0110 | (134) |
| 1000 0101 | (133) |
| 1000 0100 | (132) |
| 1000 0011 | (131) |
| 1000 0010 | (130) |
| 1000 0001 | (129) |
| 1000 0000 | (128) |
| 0111 1111 | (127) |
| ⋮ | |

TABLE 3

| BINARY NUMBERS | DECIMAL NUMBERS |
|---|---|
| 0111 1111 | (127) |
| 0111 1110 | (126) |
| 0111 1101 | (125) |
| 0111 1100 | (124) |
| 0111 1011 | (123) |
| 0111 1010 | (122) |
| 0111 1001 | (121) |
| 0111 1000 | (120) |
| 0111 0111 | (119) |
| 0111 0110 | (118) |
| 0111 0101 | (117) |
| 0111 0100 | (116) |
| 0111 0011 | (115) |
| 0111 0010 | (114) |
| 0111 0001 | (113) |
| 0111 0000 | (112) |
| 0110 1111 | (111) |
| 0110 1110 | (110) |
| 0110 1101 | (109) |
| 0110 1100 | (108) |
| 0110 1011 | (107) |
| 0110 1010 | (106) |
| 0110 1001 | (105) |
| 0110 1000 | (104) |
| 0110 0111 | (103) |
| 0110 0110 | (102) |
| 0110 0101 | (101) |
| 0110 0100 | (100) |
| 0110 0011 | (99) |
| 0110 0010 | (98) |
| 0110 0001 | (97) |
| 0110 0000 | (96) |
| 0101 1111 | (95) |
| ⋮ | |
| 0011 1111 | (63) |
| ⋮ | |

METHOD OF A/D CONVERSION BY SUCCESSIVE APPROXIMATIONS

BACKGROUND OF THE INVENTION

1. Field of the Invention

This invention relates to an improved method of analog-to-digital (A/D) conversion by successively approximating a comparison reference signal to an incoming analog signal.

2. Description of the Prior Art

Of all the techniques for A/D conversion in use today in data-acquisition systems, "successive approximations" is perhaps the most widely used. Such an A/D conversion is basically implemented by successively approximating a comparison reference signal to a sampled analog signal.

Prior to descriptions of this invention, a known prior art successive approximation technique will be discussed with reference to the drawings of FIGS. 1 through 4.

FIG. 1 shows in block diagram form a successive approximation A/D converter circuit to which this invention is also applicable.

In FIG. 1, an analog signal $S_A$ to be converted into proportional digital signals is applied through an input terminal 10 to a sample and hold circuit 12. The circuit 12 receives the analog signal and outputs sampled analog signals which are successively applied to one input of a comparator 14. The comparator 14 receives at the other input a comparison reference voltage $V_{CR}$ from a comparison reference voltage generator 16, and compares the two input signals for producing the comparison result. A successive approximation controller 18, coupled to the output of the comparator 14, successively generates an appropriate approximation control code depending on the comparison result. The generator 16 receives a reference voltage $V_R$ at its input terminal 20, and generates an appropriate comparison reference voltage $V_{CR}$ in response to the control code supplied from the controller 18. The digital equivalent of a sampled analog signal is derived after completion of the successive approximations. The conversion process will be discussed in detail later.

FIG. 2 shows an example of circuitry suited for use as the comparison reference voltage generator 16. It should be noted that this circuit is arranged to receive an approximation control code formed of only 3 bits for the purposes of explanation. In FIG. 2, the reference voltage $V_R$ is applied, through the terminal 20, to a voltage divider which consists of a plurality of resistors 31-38 arranged in series between the terminal 20 and ground. The resistors 31-38 respectively develop comparison reference voltages $V_{CR1}$-$V_{CR8}$ and are assigned binary codes "111", "110", "101", "100", "011", "010", "001" and "000", respectively as shown. The approximation control code is applied from the controller 18 to the generator 16 via input terminals 24A, 24B and 24C. Connected directly or by way of inverters to the terminals 24A, 24B and 24C is a plurality of transfer gates (or switches) 41-54 each of which is opened in response to logic "1". The analog voltages at the resistors 31-44 are selectively derived from an output terminal 60 in response to the approximation control code applied to the terminal 24A, 24B and 24C. Assuming, by way of example, that the approximation control code applied to the input terminals 24A, 24B, and 24C is "100", then the transfer gates 41, 44, 46, 48, 50, 52 and 54 are opened and all the other gates are closed and thus makes an electrical connection between the resistor 34 and the output terminal 60 by way of the gates 50, 44 and 41. Therefore, the proportional analog voltage $V_{CR4}$ developed at the resistor 34 is selected and applied to the other input of the comparator 14 through the output terminal 60.

The prior art "successive approximations" will be discussed with reference to FIG. 3 wherein the schematically illustrated voltage divider (the resistors 31-38) is the same as in FIG. 2. The controller 18 (FIG. 1) generates a first approximation control code "100", wherein all the bits are set to logic "0" except for MSB (Most Significant Bit) which is set to logic "1". The generator 16 outputs, in response to the control code "100", the first comparison reference voltage $V_{CR4}$ developed at the resistor 34. The reference voltage $V_{CR4}$ equals $V_R/2$ or a potential in the vicinity thereof. If the sampled analog signal is greater than $V_{CR4}$, the control code is so changed that the next MSB is set to logic "1" while maintaining logic "1" at the MSB and thus becomes "110". The control code "110" allows the generator 16 to output the comparison reference voltage $V_{CR2}$ developed at the resistor 32. If the analog signal is further greater than $V_{CR2}$, the control code changes to "111" by setting logic "1" to the third MSB while maintaining the other bit states. If the analog signal is still further greater than $V_{CR1}$, the control code "111" will be deemed the digital equivalent of the incoming analog signal. If the analog signal is less than $V_{CR1}$, then the control code "110" is the digital equivalent of the analog signal. Contrarily, if the analog signal is less than $V_{CR2}$, the control code changes to "101" by setting logic "0" to the next MSB and logic "1" to third MSB (viz., LSB). If the analog signal is greater than $V_{CR3}$, the control code "101" will be deemed the digital equivalent of the analog signal. If the analog signal is less than $V_{CR3}$, then the binary code "100" is the digital equivalent of the incoming signal in this particular example.

However, if the analog signal is less than $V_{CR4}$, the control code is changed to "010" by shifting logic "1" to the next MSB. The generator 16 outputs a comparison reference voltage $V_{CR6}$ developed at the resistor 36. If the analog signal is greater than $V_{CR6}$, the control code changes to "011" by setting logic "1" at the third MSB (viz., LSB) while maintaining the other bit states. If the analog signal is further greater than $V_{CR5}$, the control code "011" will be deemed the digital equivalent of the incoming analog signal. If the analog signal is less than $V_{CR5}$, then the control code "010" is the digital equivalent of the analog signal. On the other hand, if the analog signal is less than $V_{CR6}$, the control code changes to "001" by shifting logic "1" to the third MSB (or LSB). If the analog signal is greater than $V_{CR7}$, the binary code "001" will be deemed the digital equivalent of the analog signal. If the analog signal is less than $V_{CR7}$, then the binary code "000" is the digital equivalent of the incoming signal in this particular example.

It is understood that with this known method of A/D conversion, any analog signals having potential less than $V_{CR7}$ are converted into a digital "000", thus limiting the precision of the A/D conversion when the analog signal is in the vicinity of zero potential. Since it is highly desirable that the analog signals in the vicinity of zero level be exactly converted to either "001" or "000", this problem should be avoided.

One attempt to solve the above drawback involves the technique of assigning the resistors 32-38 and ground digital values "111", "110", "100", "011", "010", "001" and "000", respectively as shown in FIG. 4. However, this means that the resistor 31 should not be selected in the successive approximations or the transfer gate 47 (FIG. 2) should be removed and gives rise to the drawback that readily available IC chips cannnot be used and that a special (and therefore expensive) chips must be manufactured.

We have discussed the drawbacks of the prior arts wherein the digital output has only 3 bits, but the same discussions are ture of the case in which a digital output has more than 3 bits.

SUMMARY OF THE INVENTION

It is therefore an object of this invention to provide an improved method of A/D conversion by succesive approximations, wherein analog signals with low levels (in the vicinity of zero potential) are converted into corresponding digital signals with precision and whereby the need to manufacuture special hardware is obviated.

The present invention takes the form of a method of A/D conversion by successive approximations, wherein a sampled analog signal is converted into a n-bit digital signal (wherein "n" is a positive integer) by successively approximating a comparison reference signal to the sampled analog signal through successive comparisons therebetween, which method comprises:

setting initially all the bits of the approximation control code to logic "1" except for the MSB which is set to logic "0"; comparing the sampled analog signal with the comparison reference signal, and at the m-th comparison step (m=1, 2, 3, . . . , n), (a) when the analog signal is greater than the comparison reference signal which is proportional to the approximation control code, replacing the m-th and (m+1)th MSBs of the approximation control code with logics "1" and "0" respectively, and, (b) when the analog signal is less than the comparison reference signal, replacing the (m+1)th MSB of the approximation control code with logic "0"; and repeating the above comparison step until the "n" times of comparison are completed.

BRIEF DESCRIPTION OF THE DRAWINGS AND TABLES

The features and advantages of the present invention will become clearly appreciated from the following description taken in conjunction with the accompanying drawings and tables in which.

DESCRIPTION OF THE PREFERRED EMBODIMENT

An embodiment of this invention will be discussed with reference to FIG. 5 and Tables 1 and 3.

This invention is based on a method wherein initially all of the bits of the approximation control code are set to logic "1" except for the MSB which is set to logic "0". Therefore, the first control code is "011" in the case of a 3-bit control code (FIG. 5) and "0111 1111" in the case of a 8-bit control code (Tables 1-3).

A sampled analog signal is successively compared with a comparison reference signal variable in response to the previous comparison result. That is to say, at the m-th comparison step (wherein m=1, 2, 3, . . . ), if the analog signal is greater than the comparison reference signal, the m-th and (m+1)th MSBs of the approximation control code are replaced by logics "1" and "0" respectively, and if the analog signal is less than the comparison reference signal, then the (m+1)th MSB of the approximation control code are replaced by logic "0".

Figure 1:
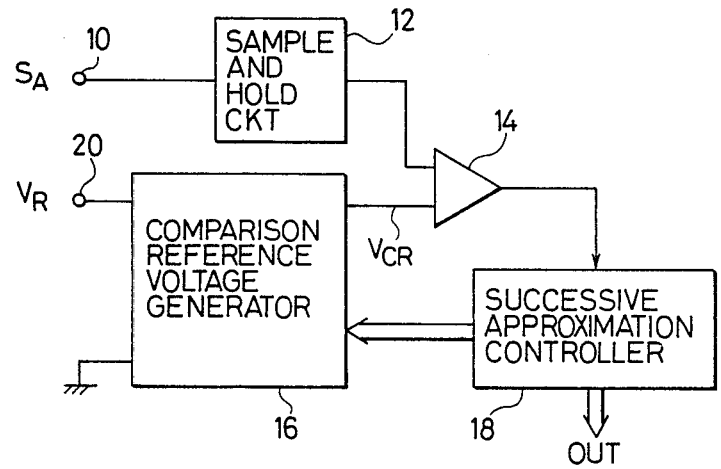
FIG. 1 is a block diagram of a successive approximation A/D converter to which this invention is applicable, as referred to previously.
Figure 2:
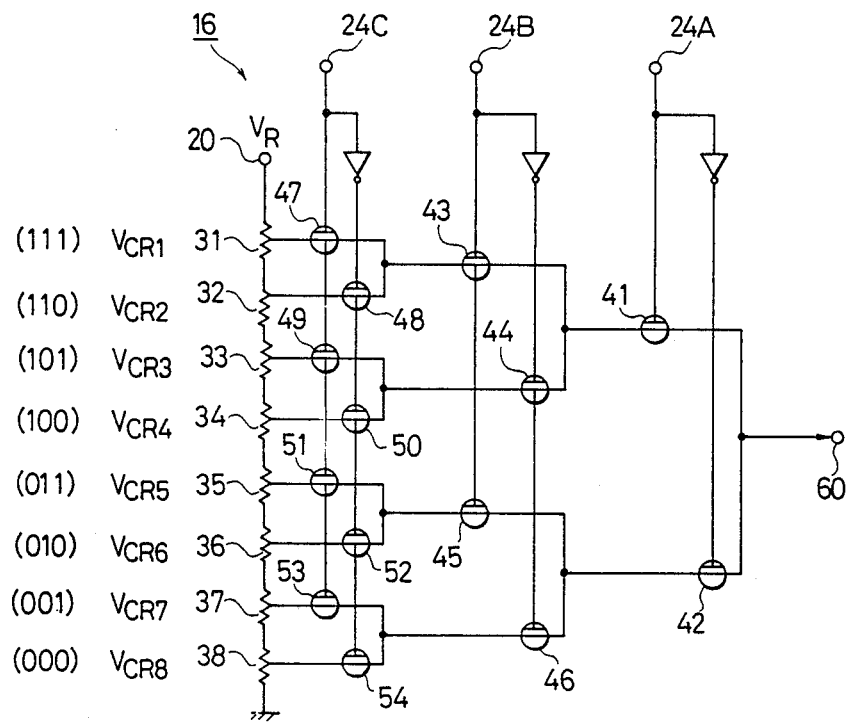
FIG. 2 shows a comparison reference voltage generator circuit which is simplified for the sake of explaining the operational characteristics thereof, as referred to previously.
Figure 3:
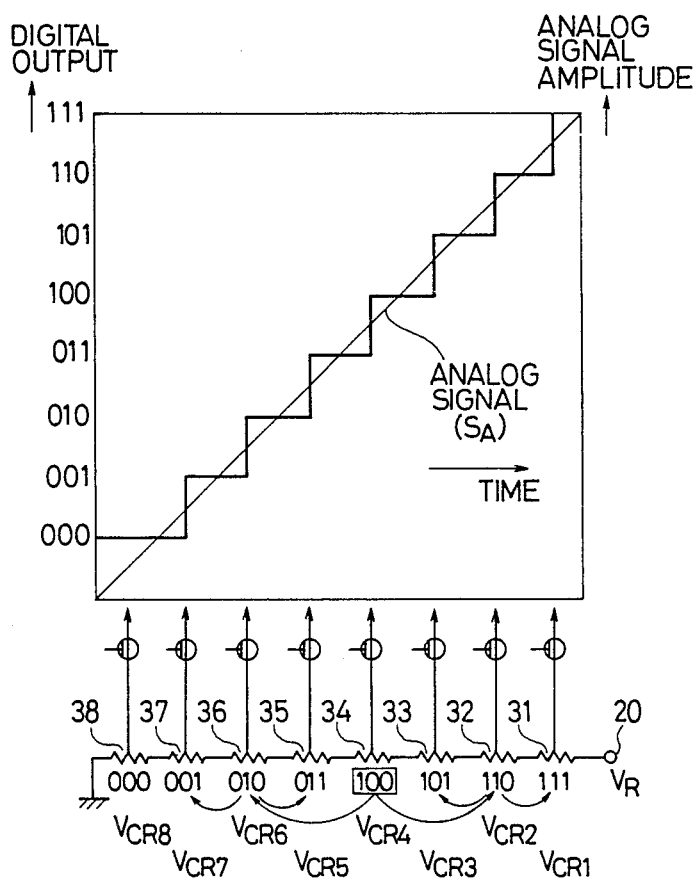
FIGS. 3 and 4 are graphs showing the analog signal inputted to, and the corresponding digital signal outputted by the previously discussed known arrangements, as referred to previously.
Figure 4:
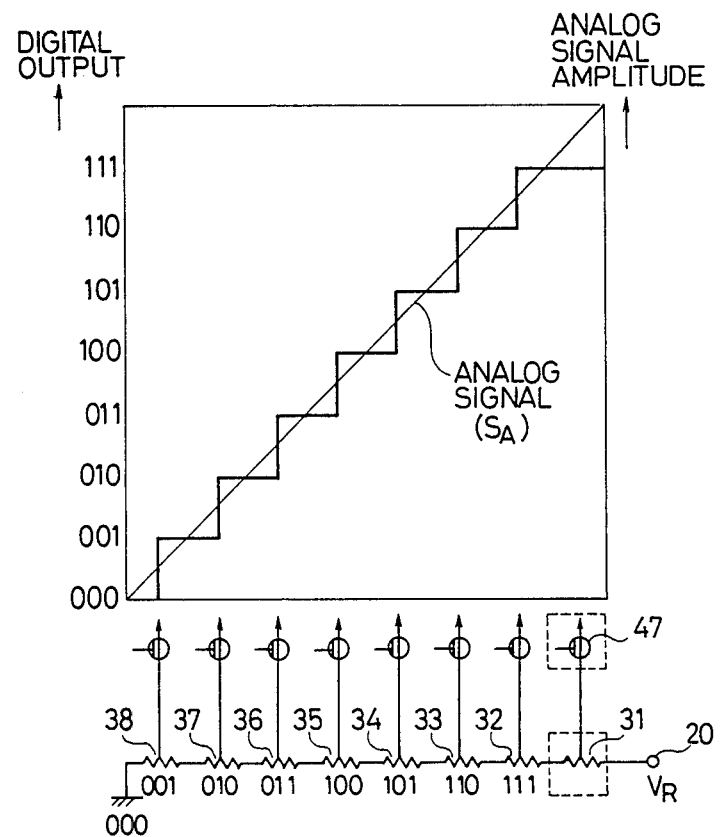
Figure 5:
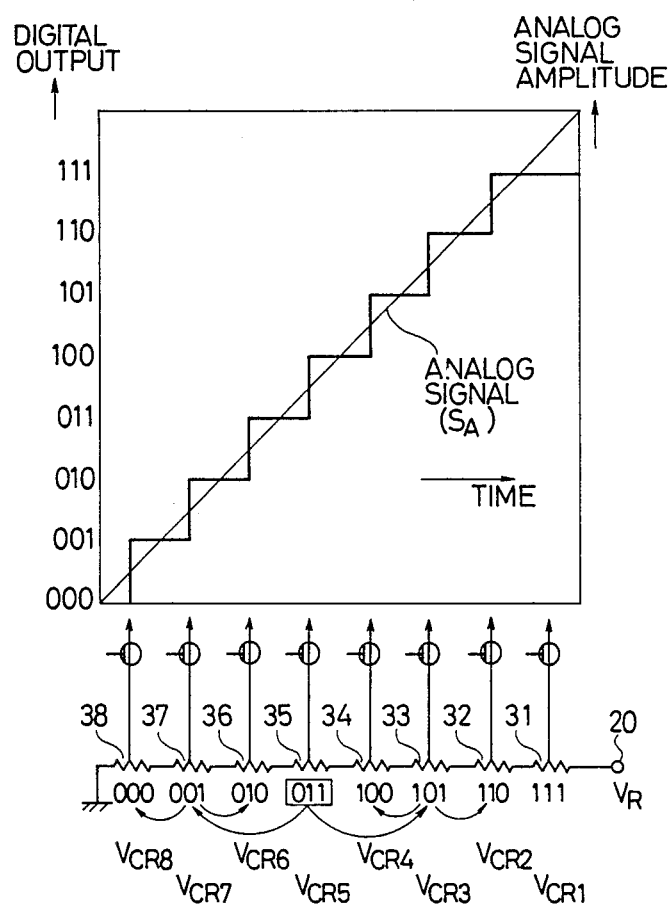
FIG. 5 is a graph similar to FIGS. 3 and 4, which shows the operational characteristics of the present invention; and Tables 1 through 3 each is a list of binary codes and corresponding decimal codes presented for describing this invention.

As shown in FIG. 5, the approximation control code is initially set to "011". If a sampled analog signal is zero or in the vicinity thereof, the control code is changed to "001" and then to "000". The code "000" is the digital equivalent of the sampled analog signal in this case. On the other hand, if a sampled analog signal has a high amplitude equal to or greater than the reference voltage $V_R$, then the digital code "111" is not selected in the present invention. However, this is not a serious drawback in that high precision is not usually required in a very high amplitude range of a sampled analog signal. The other comparison processes of FIG. 5 will readily be understandable from the above-mentioned principle of this invention.

Turning to Tables 1-3, if a sampled analog signal is zero or in the vicinity thereof, the control code is successively changed from "0111 1111", to "0011 1111", "0001 1111", "0000 1111", "0000 0111", "0000 0011", "0000 0001" and finally to "0000 0000" as shown in Table 1. Contrarily, when a sampled analog signal is equal to or greater than the reference voltage, the control code "1111 1111" is not selected in this invention as referred to with FIG. 5. Another examples of "successive approximations" are shown in Tables 2 and 3 wherein initially the approximation control code is set to "0111 1111" and wherein digital equivalents "1001 0101" (Table 2) and "0111 0010" (Table 3) are found based on the aforementioned principle of this invention.

What is claimed is:

1. A method of A/D conversion by successive approximations, wherein a sampled analog signal is converted into a n-bit digital signal (wherein "n" is a positive integer) by successively approximating a comparison reference signal to said sampled analog signal through successive comparisons therebetween, which method comprises:

setting initially all the bits of the approximation control code to logic "1" except for the MSB which is set to logic "0";

comparing said sampled analog signal with said comparison reference signal, and at the m-th comparison step (m=1, 2, 3, . . . , n), (a) when the analog signal is greater than the comparison reference signal which is proportional to said approximation control code, replacing the m-th and (m+1)th MSBs of said approximation control code with logics "1" and "0" respectively, and, (b) when the analog signal is less than the comparison reference signal, replacing the (m+1)th MSB of said approximation control code with logic "0"; and repeating the above comparison step until the "n" times of comparison are completed.

* * * * *